(12) United States Patent
Sakane et al.

(10) Patent No.: US 10,676,823 B2
(45) Date of Patent: Jun. 9, 2020

(54) PROCESSING METHOD AND PROCESSING APPARATUS

(71) Applicant: Tokyo Electron Limited, Tokyo (JP)

(72) Inventors: Ryota Sakane, Miyagi (JP); Takashi Kitazawa, Miyagi (JP); Hiroshi Nagahata, Miyagi (JP); Hideyuki Kobayashi, Miyagi (JP); Koji Yamagishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 227 days.

(21) Appl. No.: 15/825,310

(22) Filed: Nov. 29, 2017

(65) Prior Publication Data
US 2018/0148838 A1    May 31, 2018

(30) Foreign Application Priority Data
Nov. 30, 2016 (JP) ................. 2016-232642

(51) Int. Cl.
*C23C 16/455* (2006.01)
*C23C 16/505* (2006.01)
*C23C 16/40* (2006.01)

(52) U.S. Cl.
CPC ...... *C23C 16/45557* (2013.01); *C23C 16/401* (2013.01); *C23C 16/45504* (2013.01); *C23C 16/45536* (2013.01); *C23C 16/45542* (2013.01); *C23C 16/45544* (2013.01); *C23C 16/505* (2013.01)

(58) Field of Classification Search
None
See application file for complete search history.

(56) References Cited

U.S. PATENT DOCUMENTS

2006/0107898 A1* 5/2006 Blomberg ............... C23C 16/52
                                                                 118/715
2007/0131253 A1* 6/2007 Nakamura ............... B08B 7/00
                                                                 134/22.1
2015/0179415 A1* 6/2015 Sasaki ............... H01J 37/32651
                                                                 156/345.1

FOREIGN PATENT DOCUMENTS

JP           2009-016814 A       1/2009

* cited by examiner

*Primary Examiner* — Matthew D Krcha
(74) *Attorney, Agent, or Firm* — Pearne & Gordon LLP

(57) ABSTRACT

A processing method includes a first process of exposing a first sensor to a processing space within a chamber and blocking a second sensor from the processing space within the chamber; a second process of supplying a first processing gas containing a precursor gas into the chamber; a third process of controlling a state within the chamber based on a measurement value of the first sensor; a fourth process of blocking the first sensor from the processing space within the chamber and exposing the second sensor to the processing space within the chamber; a fifth process of supplying a second processing gas containing a reactant gas into the chamber; and a sixth process of controlling the state within the chamber based on a measurement value of the second sensor. The first process to the six process are repeatedly performed multiple times.

16 Claims, 6 Drawing Sheets

US 10,676,823 B2

PROCESSING METHOD AND PROCESSING APPARATUS

CROSS-REFERENCE TO RELATED APPLICATION

This application claims the benefit of Japanese Patent Application No. 2016-232642 filed on Nov. 30, 2016, the entire disclosures of which are incorporated herein by reference.

TECHNICAL FIELD

The embodiments described herein pertain generally to a processing method and a processing apparatus.

BACKGROUND

As one of methods for forming a film on a substrate, there is known an atomic layer deposition (ALD) method. In the ALD method, as a precursor gas is supplied into a chamber in which a processing target substrate is accommodated, atoms or molecules of the precursor gas containing a constitution element of a thin film are adsorbed onto the processing target substrate. Then, the atoms or molecules of the precursor gas excessively adsorbed on the processing target substrate is removed by a purge gas supplied into the chamber. Thereafter, a reactant gas containing a constituent element of the thin film is supplied into the chamber, and the processing target substrate having the atoms or molecules of the precursor gas adsorbed thereto is exposed to active species of the reactant gas, so that the required thin film is formed on the processing target substrate. The active species of the reactant gas are generated by, for example, plasma. In the ALD method, as a cycle including a single adsorption process and a single reaction process is repeated multiple times, a film of the atoms or molecules contained in the precursor gas is deposited on the substrate layer by layer.

Patent Document 1: Japanese Patent Laid-open Publication No. 2009-016814

In each process of the film formation using the ALD method, a state within the chamber such as a pressure therein is controlled based on a measurement value measured by various kinds of sensors such as a pressure gauge. In many cases, however, sensor surfaces of such sensors may be exposed to a processing space within the chamber. As a result, the same as the film is formed on the processing target substrate, a reaction product caused by the precursor gas and the reactant gas is also deposited on the sensor surfaces of the sensors which are exposed to the processing space within the chamber. Accordingly, as the cycle of the ALD is repeated, sensitivity of the sensors may be deteriorated, and accuracy of various kinds of measurement values measured by the sensors may be degraded. Thus, it may be difficult to control the state within the chamber to a required state, and accuracy, such as the quality of the film formed on the processing target substrate, may be degraded.

SUMMARY

In one exemplary embodiment, a processing method includes a first process of exposing a first sensor to a processing space within a chamber and blocking a second sensor from the processing space within the chamber; a second process of supplying a first processing gas containing a precursor gas into the chamber; a third process of controlling a state within the chamber based on a measurement value of the first sensor; a fourth process of blocking the first sensor from the processing space within the chamber and exposing the second sensor to the processing space within the chamber; a fifth process of supplying a second processing gas containing a reactant gas into the chamber; and a sixth process of controlling the state within the chamber based on a measurement value of the second sensor. The first process to the six process are repeatedly performed multiple times.

In the present disclosure, a processing method includes a first process of exposing a first sensor to a processing space within a chamber and blocking a second sensor from the processing space within the chamber; a second process of supplying a first processing gas containing a precursor gas into the chamber; a third process of controlling a state within the chamber based on a measurement value of the first sensor; a fourth process of blocking the first sensor from the processing space within the chamber and exposing the second sensor to the processing space within the chamber; a fifth process of supplying a second processing gas containing a reactant gas into the chamber; and a sixth process of controlling the state within the chamber based on a measurement value of the second sensor. Here, the first process to the six process are repeatedly performed multiple times.

The processing method may further include a seventh process of generating plasma of the second processing gas within the chamber after the sixth process. The first process to the seventh process are repeatedly performed multiple times.

The processing method may further include an eighth process of, after the first process to the seventh process are repeatedly performed a preset number of times, blocking the first sensor from the processing space within the chamber and exposing the second sensor to the processing space within the chamber after the seventh process; a ninth process of supplying a third processing gas containing an etching gas into the chamber; a tenth process of controlling the state within the chamber based on a measurement value of the second sensor; and an eleventh process of generating plasma of the third processing gas within the chamber.

The precursor gas may be a gas containing a silicon element, and the reactant gas may be a gas containing either or both of an oxygen element and a nitrogen element and not containing a silicon element.

The precursor gas may be a gas containing an aminosilane-based gas, a silicon alkoxide-based gas or a halogen element as well as a silicon element.

Each of the first sensor and the second sensor may be a pressure gauge. A pressure within the chamber may be controlled based on the measurement value of the first sensor in the third process, and the pressure within the chamber may be controlled based on the measurement value of the second sensor in the sixth process.

Each of the first sensor and the second sensor may be a capacitance manometer.

A processing apparatus includes a chamber configured to accommodate a processing target object therein; a first sensor; a second sensor; a first blocking unit configured to expose or block the first sensor to or from a processing space within the chamber; a second blocking unit configured to expose or block the second sensor to or from the processing space within the chamber; a first supply unit configured to supply a first processing gas containing a precursor gas into the chamber; a second supply unit configured to supply a second processing gas containing a reactant gas into the chamber; and a control device configured to control a processing performed on the processing target object. The control device repeatedly performs multiple times the processing including a first process of exposing the first sensor to the processing space within the chamber by controlling the first blocking unit and blocking the second sensor from the processing space within the chamber by controlling the second blocking unit; a second process of supplying the first processing gas into the chamber by controlling the first supply unit; a third process of controlling a state within the chamber based on a measurement value of the first sensor; a fourth process of blocking the first sensor from the processing space within the chamber by controlling the first blocking unit and exposing the second sensor to the processing space within the chamber by controlling the second blocking unit; a fifth process of supplying the second processing gas into the chamber by controlling the second supply unit; and a sixth process of controlling the state within the chamber based on a measurement value of the second sensor.

According to the exemplary embodiments, the deterioration of the accuracy of the processing upon the processing target substrate can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
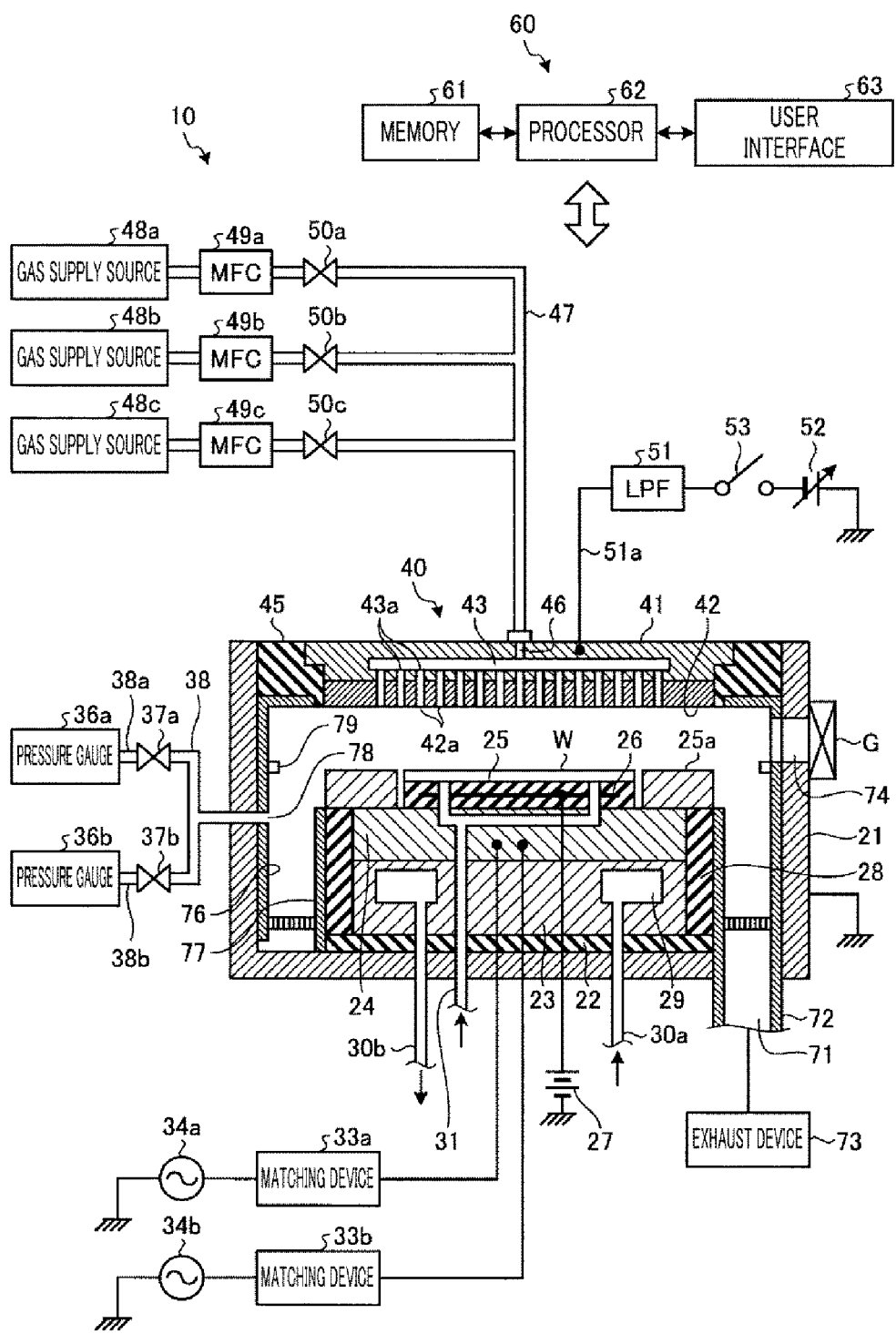
FIG. 1 is a diagram illustrating an example of a processing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a processing method and a processing apparatus of the present disclosure will be described in detail with reference to the accompanying drawings. However, it should be noted that the processing method and the processing apparatus of the present disclosure are not limited to the exemplary embodiments.

First Exemplary Embodiment

<Configuration of Processing Apparatus 10>

FIG. 1 is a diagram illustrating an example of a processing apparatus 10 according to a first exemplary embodiment. As shown in FIG. 1, for example, the processing apparatus 10 according to the present exemplary embodiment includes a chamber 21 which is made of, e.g., aluminum having an anodically oxidized surface and has a substantially cylindrical processing space formed therein. The chamber 21 is frame-grounded. The processing apparatus 10 according to the present exemplary embodiment is configured as, for example, a capacitively coupled parallel plate type plasma processing apparatus. A supporting table 23 is placed within the chamber 21 with an insulating plate 22 made of ceramic or the like therebetween. Provided on the supporting table 23 is a susceptor 24 which is made of, by way of non-limiting example, aluminum and serves as a lower electrode.

An electrostatic chuck 25 configured to attract and hold a semiconductor wafer W as an example of a processing target object by an electrostatic force is provided at a substantially central portion of a top surface of the susceptor 24. The electrostatic chuck 25 has a structure in which an electrode 26 made of a conductive film or the like is embedded between a pair of insulating layers. The electrode 26 is electrically connected with a DC power supply 27. Further, the electrostatic chuck 25 may be provided with a non-illustrated heater configured to heat the semiconductor wafer W.

A focus ring 25a is provided on the top surface of the susceptor 24 to surround the electrostatic chuck 25. The focus ring 25a can improve plasma uniformity in the vicinity of an edge of the semiconductor wafer W. The focus ring 25a is made of, by way of example, but not limitation, single crystalline silicon or the like. An inner wall member 28 is provided on side surfaces of the supporting table 23 and the susceptor 24 to surround the supporting table 23 and the susceptor 24. The inner wall member 28 is made of, by way of non-limiting example, quartz and has a substantially cylindrical shape.

A coolant path 29 is formed within the supporting table 23 along a circumferential direction of the supporting table 23, for example. A coolant of a preset temperature from a non-illustrated external chiller unit is supplied into and circulated in the coolant path 29 through a pipeline 30a and a pipeline 30b. By circulating the coolant of the preset temperature within the coolant path 29, the semiconductor wafer W on the electrostatic chuck 25 can be controlled to a predetermined temperature through a heat exchange with the coolant. Furthermore, a heat transfer gas supplied from a non-illustrated gas supply mechanism is supplied through a pipeline 31 into a gap between a top surface of the electrostatic chuck 25 and a rear surface of the semiconductor wafer W on the electrostatic chuck 25. The heat transfer gas may be, for example, a helium gas.

An upper electrode 40 is provided above the susceptor 24 serving as the lower electrode to face the susceptor 24 with the processing space within the chamber 21 therebetween. A space between the upper electrode 40 and the susceptor 24 surrounded by the chamber 21 is the processing space in which plasma is generated. The upper electrode 40 is equipped with a ceiling plate 42 serving as an electrode main body; and a ceiling plate supporting member 41 configured to support the ceiling plate 42.

The ceiling plate supporting member 41 is supported at an upper portion of the chamber 21 with an insulating member 45 therebetween. The ceiling plate supporting member 41 is made of a conductive material having relatively high thermal conductivity such as, but not limited to, aluminum having an anodically oxidized surface and has a substantially circular plate shape. Further, the ceiling plate supporting member 41 also serves as a cooling plate configured to cool the ceiling plate 42 heated by the plasma generated in the processing space. The ceiling plate supporting member 41 is provided with a gas inlet opening 46 through which a processing gas is supplied; a diffusion space 43 in which the processing gas introduced from the gas inlet opening 46 is diffused; and a multiple number of flow openings 43a as passages through which the processing gas diffused in the diffusion space 43 is flown downwards.

The ceiling plate 42 is made of a silicon-containing material such as, but not limited to, quartz and has a substantially circular plate shape. Multiple gas inlet openings 42a are formed through the ceiling plate 42 in a thickness direction thereof. The gas inlet openings 42a are arranged to respectively communicate with the corresponding flow openings 43a of the ceiling plate supporting member 41. With this configuration, the processing gas supplied into the diffusion space 43 is diffused and supplied into the chamber 21 in a shower shape through the flow openings 43a and the gas inlet openings 42a.

The gas inlet opening 46 of the ceiling plate supporting member 41 is connected with a plurality of valves 50a to 50c via a pipeline 47. The valve 50a is connected to a gas supply source 48a via a mass flow controller (MFC) 49a. If the valve 50a is controlled to be an open state, a processing gas supplied from the gas supply source 48a is supplied into the chamber 21 through the pipeline 47 while its flow rate is controlled by the MFC 49a. In the present exemplary embodiment, the gas supply source 48a supplies a precursor gas into the chamber 21. The MFC 49a and the valve 50a are an example of a first supply unit.

In the present exemplary embodiment, a gas containing, for example, a silicon element and not containing an oxygen element is used as the precursor gas. By way of example, a gas containing an organic silicon compound or a gas containing an inorganic silicon compound may be used as the precursor gas.

The gas containing the organic silicon compound may be, by way of non-limiting example, an aminosilane-based gas having a valence of 1 to 3. The aminosilane-based gas having a valence of 1 to 3 may be one or more gases selected from BTBAS (bistertiarybutylaminosilane), BDMAS (bis-dimethylaminosilane), BDEAS (bisdiethylaminosilane), DMAS (dimethylaminosilane), DEAS (diethylaminosilane), DPAS (dipropylaminosilane), BAS (butylaminosilane), DIPAS (diisopropylaminosilane), BEMAS (bisethylmethylaminosilane) and TDMAS (tridimethylaminosilane). Alternatively, the gas containing the organic silicon compound may be a siliconalkoxide-based gas such as, but not limited to, TEOS (tetraethoxysilane).

As the gas containing the inorganic silicon compound, one or more kinds of gases selected from, by way of non-limiting example, a $SiCl_4$ gas, a $SiF_4$ gas, a $Si_2Cl_6$ gas and a $SiH_2Cl_2$ gas may be used. Further, one or more kinds of gases selected from a group including the gas containing the organic silicon compound and the gas containing the inorganic silicon compound may be used as the precursor gas, for example.

Furthermore, the valve 50b is connected to a gas supply source 48b via a MFC 49b. If the valve 50b is controlled to be an open state, a gas supplied from the gas supply source 48b is supplied into the chamber 21 through the pipeline 47 while its flow rate is controlled by the MFC 49b. In the present exemplary embodiment, the gas supply source 48b supplies a purge gas into the chamber 21. The purge gas may be, by way of example, but not limitation, an inert gas such as an argon gas or a nitrogen gas.

Further, the valve 50c is connected to a gas supply source 48c via a MFC 49c. If the valve 50c is controlled to be in an open state, a gas supplied from the gas supply source 48c is supplied into the chamber 21 through the pipeline 47 while its flow rate is controlled by the MFC 49c. In the present exemplary embodiment, the gas supply source 48c supplies a reactant gas into the chamber 21. The MFC 49c and the valve 50c are an example of a second supply unit.

For example, in the present exemplary embodiment, a gas containing either or both of an oxygen element and a nitrogen element and not containing a silicon element is used as the reactant gas. To elaborate, one or more kinds of gases selected from an $O_2$ gas, a CO gas, a $CO_2$ gas, an $O_3$ gas, a $H_2O$ gas, a NO gas, a $N_2O$ gas, a $N_2$ gas and a $NH_3$ gas may be used as the reactant gas.

Moreover, in supplying the precursor gas and the reactant gas of the present exemplary embodiment into the chamber 21, an additive gas may be used for the purposes of improving productivity such as reduction of using amounts of the precursor gas and the reactant gas and uniformity of gas distribution within the chamber 21. The additive gas may be, by way of example, but not limitation, an inert gas such as an argon gas or a nitrogen gas. For example, the inert gas supplied from the gas supply source 48b through the valve 50b and the MFC 49b may be added to the precursor gas which is supplied from the gas supply source 48a through the valve 50a and the MFC 49a. Furthermore, by way of another example, the inert gas supplied from the gas supply source 48b through the valve 50b and the MFC 49b may be added to the reactant gas which is supplied from the gas supply source 48c through the valve 50c and the MFC 49c.

Control over flow rates of the individual gases by the individual MFCs 49a to 49c and opening/closing of the individual valves 50a to 50c are performed by a control device 60 to be described later.

A variable DC power supply 52 is electrically connected to the upper electrode 40 via a cable 51a and a low pass filter (LPF) 51. On/off of a DC voltage supplied to the upper electrode 40 from the variable DC power supply 52 via the LPF 51 and the cable 51a is controlled by a switch 53. Control over the voltage of the variable DC power supply 52 and the on/off of the switch 53 are performed by the control device 60 to be described later.

The susceptor 24 serving as the lower electrode is electrically connected with a high frequency power supply 34a via a matching device 33a. Further, the susceptor 24 is also connected with a high frequency power supply 34b via a matching device 33b. The high frequency power supply 34a is configured to supply a high frequency power of a first frequency equal to or higher than 27 MHz, e.g., 40 MHz to the susceptor 24 via the matching device 33a. The high frequency power supply 34b is configured to supply a high frequency power of a second frequency equal to or lower than 13.56 MHz, e.g., 2 MHz to the susceptor 24 via the matching device 33b. As the high frequency power of the first frequency is supplied to the susceptor 24, plasma of the processing gas is generated in the processing space. Further, as the high frequency power of the second frequency is supplied to the susceptor 24, active species such as ions in the plasma are attracted into the semiconductor wafer W on the electrostatic chuck 25. The high frequency powers supplied from the high frequency power supplies 34a and 34b are controlled by the control device 60 to be described later.

An opening 78 is formed at a sidewall of the chamber 21, and a pipeline 38 is connected to the opening 78. The pipeline 38 is branched into two, and one end of a valve 37a is connected to one branch and one end of a valve 37b is connected to the other branch. The other end of the valve 37a is connected to a pressure gauge 36a via a pipeline 38a, and the other end of the valve 37b is connected to a pressure gauge 36b via a pipeline 38b. In the present exemplary embodiment, the pressure gauges 36a and 36b may be implemented by, but not limited to, capacitance manometers. Further, in the following description, the valve 37a may sometimes be referred to as a valve A, and the valve 37b may sometimes be referred to as a valve B.

As the valve 37a is controlled to be in an open state, the pipeline 38 and the pipeline 38a are allowed to communicate with each other. Accordingly, the pressure gauge 36a is exposed to the processing space within the chamber 21 through the opening 78 formed at the sidewall of the chamber 21, and, thus, the pressure gauge 36a is capable of measuring a pressure within the processing space. Meanwhile, as the valve 37a is controlled to be in a closed state, the pipeline 38 and the pipeline 38a are disconnected from each other. Accordingly, the pressure gauge 36a is blocked from the processing space within the chamber 21.

Further, as the valve 37b is controlled to be in an open state, the pipeline 38 and the pipeline 38b are allowed to communicate with each other. Accordingly, the pressure gauge 36b is exposed to the processing space within the chamber 21 through the opening 78 formed at the sidewall of the chamber 21, and, thus, the pressure gauge 36b is capable of measuring a pressure within the processing space. Meanwhile, as the valve 37b is controlled to be in a closed state, the pipeline 38 and the pipeline 38b are disconnected from each other. Accordingly, the pressure gauge 36b is blocked from the processing space within the chamber 21.

The control over the opening/closing of the valves 37a and 37b are performed by the control device 60 to be described later. The valve 37a is an example of a first blocking unit, and the valve 37b is an example of a second blocking unit. Further, the pressure gauge 36a is an example of a first sensor, and the pressure gauge 36b is an example of a second sensor.

An exhaust port 71 is provided at a bottom portion of the chamber 21, and an exhaust device 73 is connected to the exhaust port via an exhaust line 72. The exhaust device 73 includes a vacuum pump such as, but not limited to, a DP (Dry Pump) or a TMP (Turbo Molecular Pump), and is configured to decompress the inside of the chamber 21 to a required vacuum level. An exhaust rate of the exhaust device 73 or the like is controlled by the control device 60 to be described later. By way of example, when the precursor gas is supplied into the chamber 21 from the gas supply source 48a, the control device 60 controls the valve 37a to be opened while controlling the valve 37b to be closed. Then, the control device 60 adjusts the pressure within the chamber 21 to a preset pressure by controlling the exhaust rate of the exhaust device 73 or the like based on the pressure within the chamber 21 measured by the pressure gauge 36a. Further, for example, when the reactant gas is supplied into the chamber 21 from the gas supply source 48c, the control device 60 controls the valve 37a to be closed while controlling the valve 37b to be opened. Then, the control device 60 adjusts the pressure within the chamber 21 to a predetermined pressure by controlling the exhaust rate of the exhaust device 73 or the like based on the pressure within the chamber 21 measured by the pressure gauge 36b.

The sidewall of the chamber 21 is also provided with an opening 74 through which a carry-in/out of the semiconductor wafer W is performed. The opening 74 is opened/closed by a gate valve G. Further, a deposition shield 76 is provided at an inner wall of the chamber 21 in a detachable manner along an inner wall surface thereof. In addition, a deposition shield 77 is detachably provided on an outer surface of the inner wall member 28 as well. The deposition shields 76 and 77 are configured to suppress an etching byproduct (deposit) from adhering to the inner wall of the chamber 21 and the inner wall member 28. Further, a conductive member (GND block) 79, which is connected to the ground, is provided at a position of the deposition shield 76 which is substantially on a level with the semiconductor wafer W placed on the electrostatic chuck 25. The GND block 79 is configured to suppress an abnormal discharge within the chamber 21.

An overall operation of the above-described processing apparatus 10 is controlled by the control device 60. The control device 60 includes a memory 61 such as, but not limited to, a ROM (Read Only Memory) or a RAM (Random Access Memory); processor 62 such as, but not limited to, a CPU (Central Processing Unit) or a DSP (Digital Signal Processor); and a user interface 63. The user interface 63 includes a keyboard through which a user such as a process manager inputs commands to manage the processing apparatus 10; a display configured to visually display an operational status of the processing apparatus 10; and so forth.

The memory 61 stores therein a control program (software) or a recipe including processing condition data for implementing various kinds of processings in the processing apparatus 10. The processor 62 reads out a required recipe from the memory 61 in response to an instruction from the user through the user interface 63 and executes the corresponding recipe, thus controlling the individual components of the processing apparatus 10. Accordingly, a required processing such as a film forming processing is performed by the processing apparatus 10. Further, the control program or the recipe including the processing condition data may be used by being stored in a computer-readable recording medium or may be transmitted from another apparatus through, for example, a communication line. Here, the computer-readable recording medium may be, by way of non-limiting example, a hard disk, a CD (Compact disc), a DVD (Digital Versatile Disc), a flexible disk, a semiconductor memory, or the like.

Figure 2:
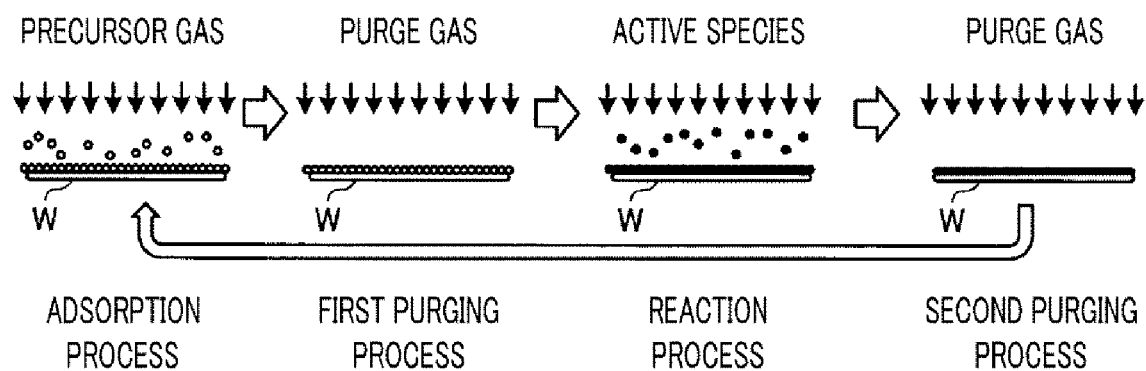
FIG. 2 is a schematic diagram illustrating an example of individual processes of PEALD.

Here, the film forming processing performed by the processing apparatus 10 according to the present exemplary embodiment will be explained. The processing apparatus 10 according to the present exemplary embodiment is configured to form a silicon oxide film on the semiconductor wafer W by PEALD (Plasma-Enhanced ALD). FIG. 2 is a schematic diagram illustrating an example of individual processes of the PEALD. In the PEALD, the precursor gas is first supplied to the semiconductor wafer W in an adsorption process. Accordingly, molecules of the precursor gas are adsorbed onto the surface of the semiconductor wafer W.

Figure 3:
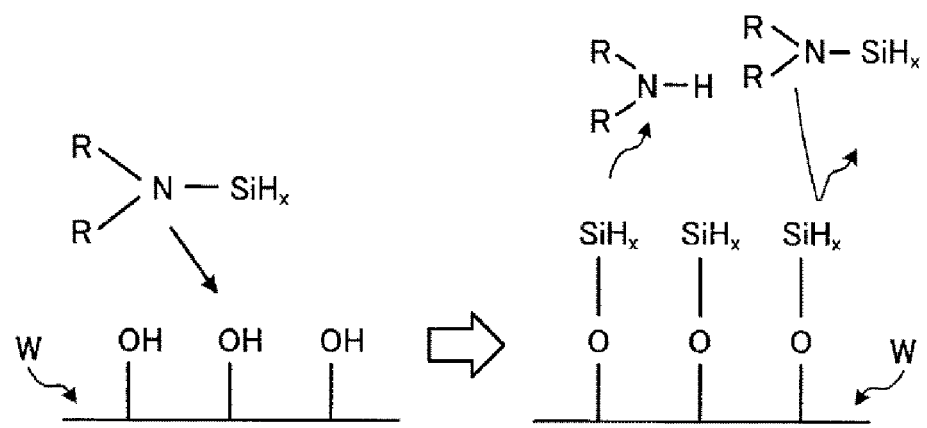
FIG. 3 is a diagram illustrating a detailed example of an adsorption process and a first purging process.

To elaborate, as depicted on the left side of FIG. 3, for example, if molecules of, e.g., the aminosilane-based gas contained in the precursor gas are supplied to the semiconductor wafer W, among silyl groups and the amine groups constituting the molecules of the aminosilane-based gas, the amine groups make a substitution reaction with OH groups existing on the surface of the semiconductor wafer W. Further, the silyl groups combine with oxygen elements in the OH groups on the semiconductor wafer W to be chemically adsorbed to the surface of the semiconductor wafer W. Further, since an end of each silyl group is terminated with a hydrogen element, no more substitution reaction occurs between the silyl group and other molecules of the aminosilane-based gas. That is, in the adsorption process, the surface of the semiconductor wafer W is terminated with a single molecular layer of the silyl groups.

Thereafter, in a first purging process shown in FIG. 2, for example, a purge gas is supplied onto the semiconductor wafer W. Accordingly, the molecules of the precursor gas excessively supplied onto the semiconductor wafer W and so forth are removed by the purge gas. To be more specific, as depicted on the right side of FIG. 3, for example, reaction byproducts such as amine compounds generated by the amine groups released through the substitution reaction or the molecules of the precursor gas excessively supplied onto the semiconductor wafer W is removed by the purge gas.

Figure 4:
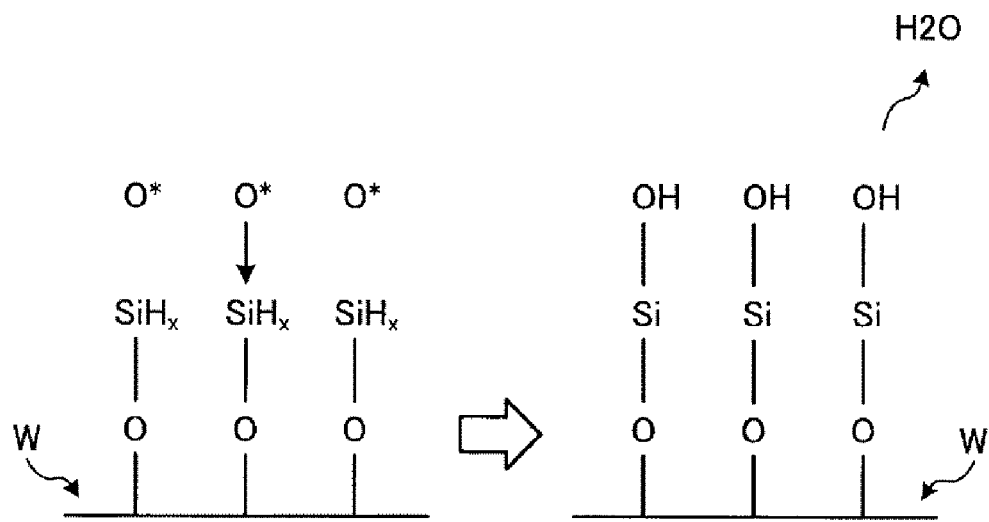
FIG. 4 is a diagram illustrating a detailed example of a reaction process and a second purging process.

Subsequently, in a reaction process shown in FIG. 2, active species are supplied to the semiconductor wafer W. Accordingly, the molecules of the precursor gas adsorbed onto the semiconductor wafer W react with the active species, so that a silicon oxide film is formed. In the present exemplary embodiment, as depicted on the left side of FIG. 4, for example, by exciting the reactant gas into plasma, oxygen radicals (O*) are generated as the active species. As the generated active species react with the silyl groups adsorbed to the surface of the semiconductor wafer W, the silicon oxide film is formed on the semiconductor wafer W, as illustrated on the right side of FIG. 4, for example. Further, OH groups are formed again on a surface of the formed silicon oxide film.

Next, in a second purging process shown in FIG. 2, for example, the purge gas is supplied onto the semiconductor wafer W. Accordingly, the active species excessively supplied onto the semiconductor wafer W, reaction byproducts such as water molecules generated by the reaction between the active species and the silyl groups on the surface of the semiconductor wafer W, and so forth are removed by the purge gas. For example, as depicted on the right side of FIG. 4, since the OH groups are formed on the surface of the silicon oxide film again, a single layer of silyl groups can be formed again by supplying the precursor gas onto the semiconductor wafer W again in an absorption process.

As stated above, a cycle including the adsorption process, the first purging process, the reaction process and the second purging process is repeated multiple times, a preset thickness of the silicon oxide film is formed on the semiconductor wafer W.

Here, though the required film is deposited on the semiconductor wafer W as the cycle of the PEALD is repeated, this film is also deposited on a component within the chamber 21 having OH groups on the surface thereof as a deposit. For example, a pressure gauge may be provided within the chamber 21 to measure the pressure of the gas supplied in each process of the PEALD, and the pressure within the chamber 21 may be measured by the single pressure gauge in all of the individual processes of the PEALD. In this case, the silicon oxide film may be deposited on a sensor surface of this pressure gauge as the deposit, the same as the silicon oxide film is deposited on the semiconductor wafer W.

Figure 5:
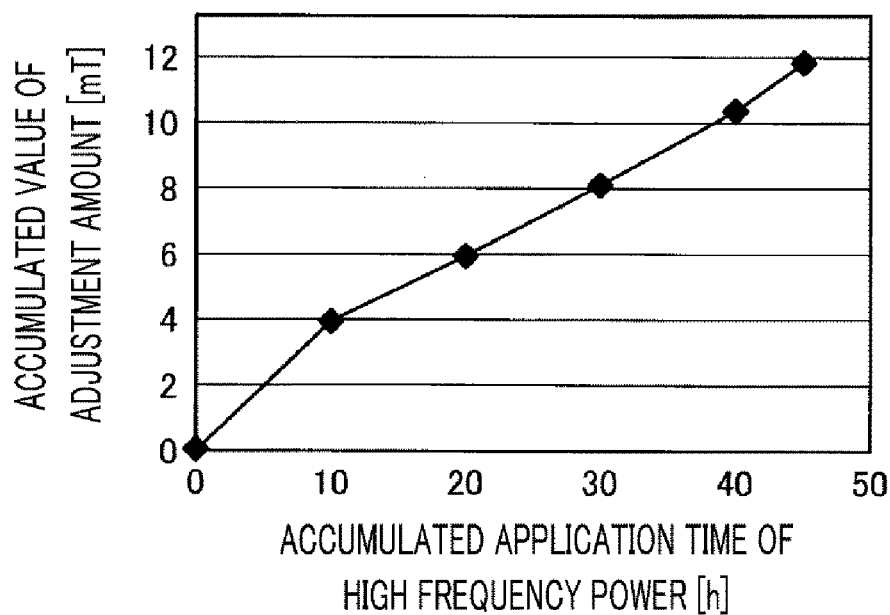
FIG. 5 is a diagram illustrating an example of an accumulated value of an adjustment amount of a pressure gauge.

If the deposit adheres to the sensor surface of the pressure gauge, an error of a measurement value of the pressure gauge increases. Therefore, a measurement error of the pressure gauge needs to be adjusted during the processes of the PEALD. FIG. 5 is a diagram showing an example of an accumulated value of an adjustment amount of the pressure gauge. In FIG. 5, a horizontal axis represents an accumulated application time of the high frequency power supplied to generate plasma of the reaction gas, and a vertical axis indicates an accumulated value of the adjustment amount. If an accumulated processing time of the PEALD is lengthened, that is, the accumulated application time of the high frequency power is lengthened, a thickness of the deposit adhering to the sensor surface of the pressure gauge is increased. Therefore, as shown in FIG. 5, for example, with the increase of the accumulated application time of the high frequency power, the accumulated value of the adjustment amount of the measurement error is also increased. If the accumulated value of the adjustment amount of the measurement error is increased, the measurement error may be soon increased beyond a tolerance range, so that the accuracy of the pressure adjustment within the chamber 21 is deteriorated.

To avoid this problem, in the processing apparatus 10 according to the present exemplary embodiment, a pressure gauge exposed to the inside of the chamber 21 when supplying the precursor gas into the chamber 21 and a pressure gauge exposed to the inside of the chamber 21 when supplying the reactant gas into the chamber 21 are provided separately. Accordingly, it is possible to suppress at least both of the adsorption process and the reaction process among the four processes shown in FIG. 2 from being performed on the sensor surface of each of these pressure gauges.

For example, in the adsorption process shown in FIG. 2, if all the OH groups existing on the semiconductor wafer W are terminated with the silyl groups of the molecules of the precursor gas, the ends of the silyl groups are terminated with hydrogen atoms and do not have OH groups. As a result, the molecules of the precursor gas are not adsorbed to the semiconductor wafer W any more. Thus, in case that the adsorption process and the first purging process are repeated alternately, the thickness of the deposit adhering to the sensor surface of the pressure gauge is not increased.

Further, in the reaction process shown in FIG. 2, for example, if the silyl groups of the molecules of the precursor gas do not exist on the semiconductor wafer W, the silicon oxide film is not formed on the semiconductor wafer W. Therefore, even if only the reaction process is repeated multiple times, the deposit hardly adheres to the sensor surface of the pressure gauge.

As stated above, by providing the pressure gauge exposed to the inside of the chamber 21 when supplying the precursor gas into the chamber 21 and the pressure gauge exposed to the inside of the chamber 21 when supplying the reactant gas into the chamber 21 separately, the increase of the thickness of the deposit adhering to each pressure gauge can be suppressed. Accordingly, the increase of the measurement error of each pressure gauge can be suppressed within a preset range and the deterioration of the accuracy of each pressure gauge can be suppressed within a preset range. Therefore, the deterioration of processing accuracy of the processing apparatus 10 according to the present exemplary embodiment can be suppressed.

Furthermore, since the increase of the thickness of the deposit adhering to each pressure gauge can be suppressed, the adjustment frequency of the measurement error of each pressure gauge can be reduced. Hence, the processing throughput can be improved.

In addition, as illustrated in FIG. 2, for example, if the adsorption process is performed, the molecules of the precursor gas float within the chamber 21 until the first purging process is conducted. Thus, if a pressure measurement in the first purging process and a pressure measurement in the reaction process are performed by a single pressure gauge, the deposit adhering to the sensor surface of the pressure gauge may be increased. Further, if the reaction process is performed, the active species float within the chamber 21 until the second purging process is performed. Thus, if a pressure measurement in the second purging process and a pressure measurement in an adsorption process of a next cycle are performed by a single pressure gauge, the deposit adhering to the sensor surface of the pressure gauge may be increased. Therefore, it is desirable that the pressure measurement in the adsorption process and the first purging process and the pressure measurement in the reaction process and the second purging process are performed by using the individual pressure gauges.

Further, though the present exemplary embodiment has been described for the case where the active species are generated by exciting the reactant gas into the plasma, if the semiconductor wafer W or the component exposed to the inside of the chamber 21 is maintained at a high temperature, the active species may be generated from the reactant gas by heat energy from the corresponding high temperature. For this reason, it is desirable that the precursor gas and the reactant gas are not supplied into the chamber 21 at the same time and, also, the residue of the precursor gas and the reactant gas are not mixed with each other.

<Sequence of Processing>

Figure 6:
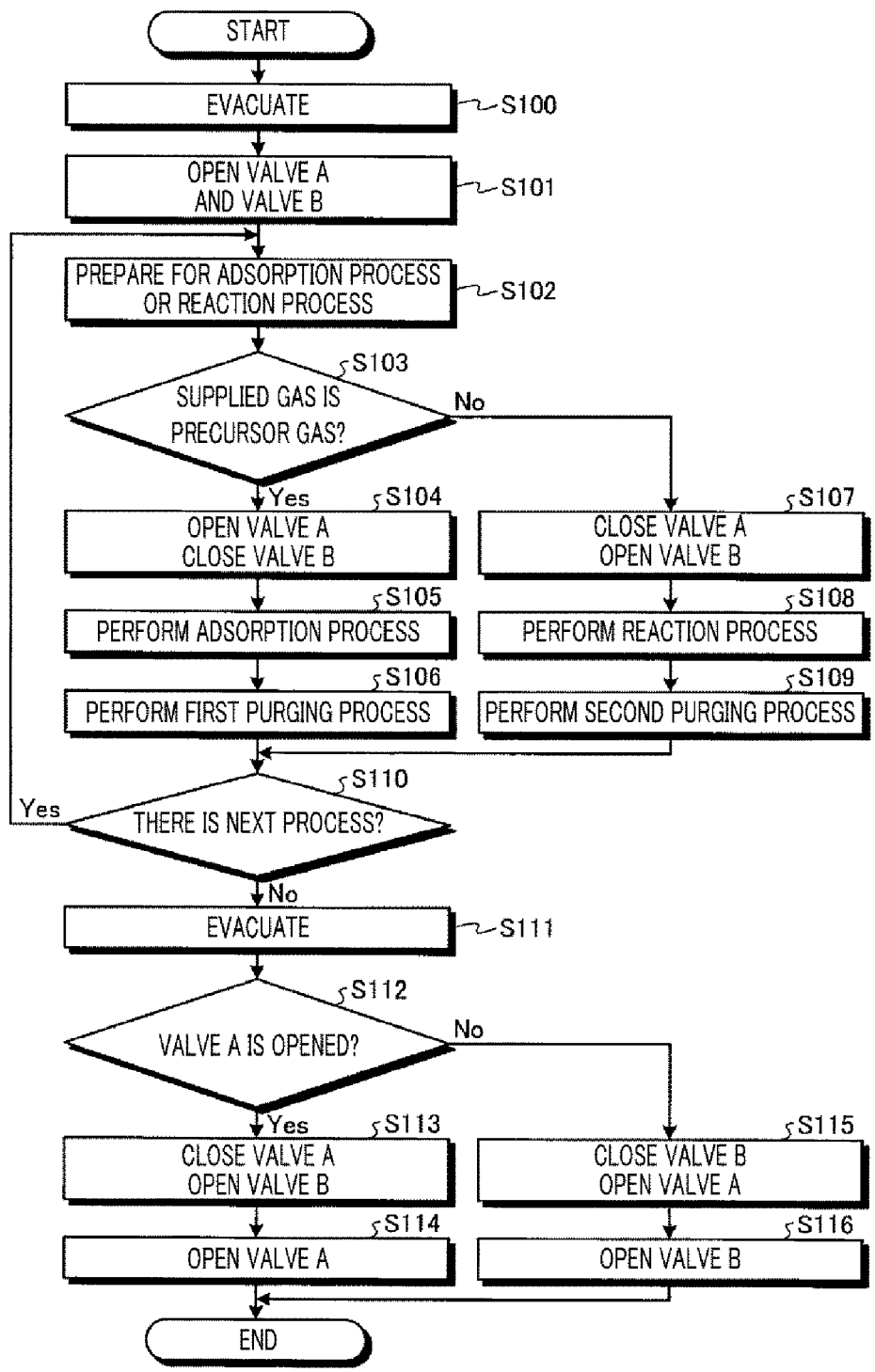
FIG. 6 is a flowchart illustrating an example of a sequence of a processing according to the first exemplary embodiment.

FIG. 6 is a flowchart for describing an example of a sequence of a processing according to the first exemplary embodiment. The processing shown in FIG. 6 is performed mainly by the control device 60.

First, a semiconductor wafer W is carried into the chamber 21 and placed on the electrostatic chuck 25, and the gate valve G is closed. The control device 60 controls the electrostatic chuck 25 such that the semiconductor wafer W is attracted to and held on the top surface of the electrostatic chuck 25 by the electrostatic force. Then, the control device 60 starts the vacuum evacuation of the chamber 21 by controlling the exhaust device 73 (S100). Next, the control device 60 controls the valve 37a (valve A) and the valve 37b (valve B) to be opened (S101).

Thereafter, the control device 60 prepares for the adsorption process or the reaction process according to the recipe read out from the memory 61 (S102). The preparation for the adsorption process and the reaction process includes, for example, a processing of adjusting the temperature of the semiconductor wafer W by performing the temperature adjustment of the coolant supplied into and circulated in the coolant path 29 of the supporting table 23, the temperature adjustment of the heater within the electrostatic chuck 25 and the pressure adjustment of the heat transfer gas supplied between the electrostatic chuck 25 and the semiconductor wafer W.

Afterwards, the control device 60 determines, by referring to the recipe, whether the gas supplied into the chamber 21 is the precursor gas (S103). If the gas supplied into the chamber 21 is the precursor gas (S103: Yes), the control device 60 controls the valve A to be still opened while controlling the valve B to be closed (S104). Accordingly, the pressure gauge 36a is exposed to the processing space within the chamber 21, whereas the pressure gauge 36b is blocked from the processing space within the chamber 21. The process S104 is an example of a first process.

Then, the control device 60 performs the adsorption process according to the recipe (S105). In the adsorption process, the control device 60 controls the valve 50a to be opened and the valves 50b and 50c to be closed, for example, and, also, adjusts the flow rate of the precursor gas supplied into the chamber 21 from the gas supply source 48a by controlling the MFC 49a. Accordingly, the precursor gas is supplied into the chamber 21. The process of supplying the precursor gas into the chamber 21 is an example of a second process. Further, the control device 60 adjusts the pressure within the chamber 21 by controlling the exhaust rate of the exhaust device 73 based on, for example, the pressure within the chamber 21 measured by the pressure gauge 36a. Accordingly, the molecules of the precursor gas are adsorbed onto the semiconductor wafer W under a preset condition. The process of adjusting the pressure of the precursor gas supplied into the chamber 21 is an example of a third process.

Next, the control device 60 performs the first purging process (S106). In the first purging process, the control device 60 controls the valves 50a and 50c to be closed while controlling the valve 50b to be in an open state and, also, controls the flow rate of the purge gas supplied into the chamber 21 from the gas supply source 48b by controlling the MFC 49b. Furthermore, the control device 60 adjusts the pressure within the chamber 21 by controlling the exhaust rate of the exhaust device 73 based on the pressure within the chamber 21 measured by, for example, the pressure gauge 36a. Accordingly, the purge gas is supplied onto the semiconductor wafer W under a preset condition, so that the molecules of the precursor gas excessively supplied, the reaction byproduct, and so forth are removed. Then, the control device 60 performs a processing of a process S110.

Meanwhile, in case that the gas supplied into the chamber 21 is not the precursor gas (S103: No), that is, in case that the gas supplied into the chamber 21 is the reactant gas, the control device 60 controls the valve A to be closed while controlling the valve B to be opened (S107). Accordingly, the pressure gauge 36a is blocked from the processing space within the chamber 21, and the pressure gauge 36b is exposed to the processing space within the chamber 21. The process S107 is an example of a fourth process.

Then, the control device 60 performs the reaction process according to the recipe (S108). For example, in the reaction process, the control device 60 controls the valves 50a and 50b to be closed and the valve 50c to be opened and, also, controls the flow rate of the reactant gas supplied into the chamber 21 from the gas supply source 48c by controlling the MFC 49c. Accordingly, the reactant gas is supplied into the chamber 21. The process of supplying the reactant gas into the chamber 21 is an example of a fifth process. Further, the control device 60 adjusts the pressure within the chamber 21 by controlling the exhaust rate of the exhaust device 73 based on the pressure within the chamber 21 measured by, for example, the pressure gauge 36b. The process of adjusting the pressure of the reactant gas supplied into the chamber 21 is an example of a sixth process. Further, the control device 60 controls the high frequency power supplies 34a and 34b to apply the high frequency powers to the susceptor 24, so that the plasma of the reactant gas is generated in the processing space within the chamber 21. As a result, the active species such as oxygen radicals are supplied onto the semiconductor wafer W under a preset condition, so that the silicon oxide film is formed on the semiconductor wafer W. The process of generating the plasma of the reactant gas in the processing space within the chamber 21 is an example of a seventh process.

Subsequently, the control device 60 performs the second purging process (S109). In the second purging process, the control device 60 controls the valves 50a and 50c to be closed while controlling the valve 50b to be opened and, also, controls the flow rate of the purge gas supplied into the chamber 21 from the gas supply source 48b by controlling the MFC 49b. Furthermore, the control device 60 adjusts the pressure within the chamber 21 by controlling the exhaust rate of the exhaust device 73 based on the pressure within the chamber 21 measured by, for example, the pressure gauge 36b. Accordingly, the purge gas is supplied onto the semiconductor wafer W under a preset condition, so that unreacted active species, the reaction byproduct, or the like within the chamber 21 is removed.

Thereafter, referring to the recipe, the control device 60 determines whether there remains a next process (S110). If there still exists a next process (S110: Yes), the control device 60 performs the processing of the process S102 again.

Meanwhile, if there remains no next process (S110: No), the control device 60 starts the vacuum evacuation of the chamber 21 again (S111). To elaborate, the control device 60 controls the valves 50a to 50c to be closed and controls the exhaust device 73 to exhaust the gas remaining in the chamber 21.

Then, the control device 60 determines whether the valve A is in an open state (S112). In case that the valve A is in the open state (S112: Yes), the residual gas within the valve A and the pipeline 38a is already exhausted by the vacuum evacuation which is begun in the process S111. Therefore, the control device 60 controls the valve A to be closed and the valve B to be opened (S113). As a result, the residual gas in the valve B and the pipeline 38b is exhausted by the vacuum evacuation which is begun in the process S111. Then, the control device 60 controls the valve A to be opened (S114) and ends the processing shown in FIG. 6.

Meanwhile, If the valve A is not in the open state (S112: No), that is, if the valve B is in an open state, the residual gas within the valve B and the pipeline 38b is already exhausted by the vacuum evacuation which is begun in the process s111. Therefore, the control device 60 controls the valve B to be closed and the valve A to be opened (S115). As a result, the residual gas in the valve A and the pipeline 38a is exhausted by the vacuum evacuation which is begun in the process S111. Then, the control device 60 controls the valve B to be opened (S116) and ends the processing shown in FIG. 6.

In the above, the first exemplary embodiment has been described. As clearly seen from the above description, the processing apparatus 10 according to the present exemplary embodiment controls the valve A and the valve B such that the different pressure gauges are exposed to the inside of the chamber 21 when supplying the precursor gas into the chamber 21 and when supplying the reactant gas into the chamber 21 in each cycle of the PEALD. Accordingly, the increase of the thickness of the deposit adhering to each pressure gauge can be suppressed, so that the reduction of the accuracy of each pressure gauge can be suppressed within a preset range. Thus, the processing apparatus 10 according to the present exemplary embodiment is capable of suppressing the deterioration of the accuracy of the processing.

Second Exemplary Embodiment

The processing apparatus 10 according to the above-described first exemplary embodiment is configured to perform the film formation on the semiconductor wafer W by the PEALD. Meanwhile, the processing apparatus 10 according to a second exemplary embodiment is configured to perform, within the single chamber 21, the film formation on the semiconductor wafer W by the PEALD and then to perform an etching processing subsequently on the semiconductor wafer W on which the film formation is already performed.

<Configuration of Processing Apparatus 10>

Figure 7:
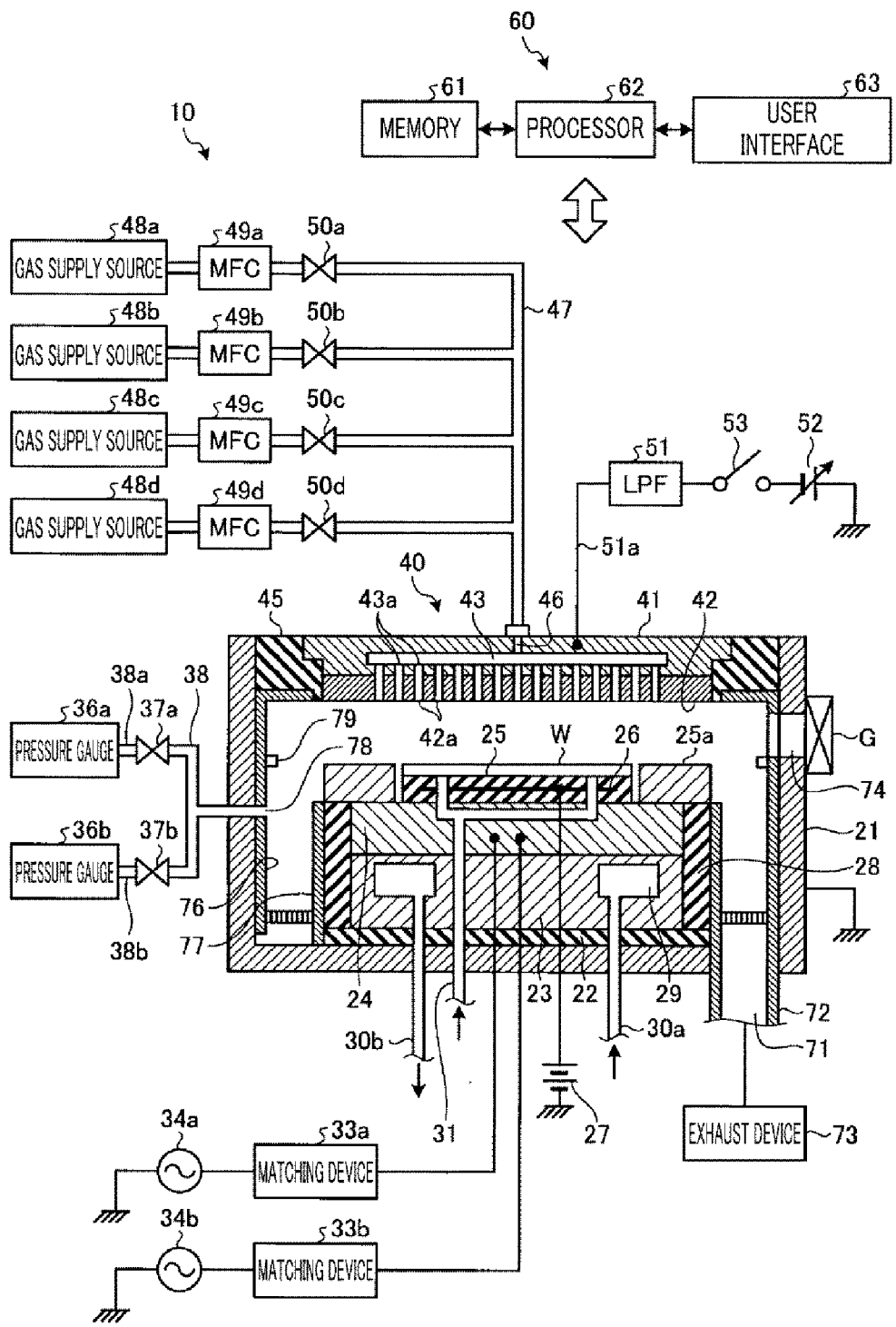
FIG. 7 is a diagram illustrating an example of a processing apparatus according to a second exemplary embodiment.

FIG. 7 is a diagram illustrating an example of the processing apparatus 10 according to the second exemplary embodiment. Since parts assigned the same reference numerals as those of FIG. 1 have the same configuration or function as shown in FIG. 1 except the following, redundant description will be omitted.

In the plasma processing apparatus 10 according to the present exemplary embodiment, a plurality of valves 50a to 50d is connected to the pipeline 47. The valve 50d is connected to a gas supply source 48d via a mass flow controller (MFC) 49d. If the valve 50d is controlled to be an open state, a gas supplied from the gas supply source 48d is supplied into the chamber 21 through the pipeline 47 while its flow rate is controlled by the MFC 49d. In the present exemplary embodiment, the gas supply source 48d is configured to supply an etching gas into the chamber 21. As an example of the etching gas, a CF-based gas or a CF-based gas with an oxygen gas or a hydrogen gas added thereto may be used. Adjustment of the flow rate of the etching gas by the MFC 49d and opening/closing of the valve 50d are controlled by the control device 60.

In the present exemplary embodiment, the control device 60 forms a film having a preset thickness on the semiconductor wafer W by repeating the cycle of the PEALD shown in FIG. 2 a preset number of times. Subsequently, the control device 60 adjusts the pressure within the chamber 21 to a predetermined pressure by supplying the etching gas into the chamber 21. At this time, the control device 60 controls the valve A to be closed and the valve B to be opened. The control device 60 adjusts the pressure within the chamber 21 based on the pressure measurement value measured by the pressure gauge 36b exposed to the processing space within the chamber 21.

Here, in the processing apparatus 10 according to the present exemplary embodiment, the valve A and the valve B are controlled such that the pressure gauge exposed to the inside of the chamber 21 when supplying the precursor gas into the chamber 21 and the pressure gauge exposed to the inside of the chamber 21 when supplying the reactant gas into the chamber 21 in each cycle of the PEALD are different. Accordingly, the deposit adhering to each pressure gauge can be suppressed. Thus, even when the etching processing is performed in the same chamber following the film formation such as the PEALD or the like, the pressure gauges used in the film formation can be still used.

When the etching processing is performed, since the etching gas is excited into plasma, active species such as oxygen radicals (O*) are generated. Therefore, in each cycle of the PEALD, if the pressure gauge exposed to the inside of the chamber 21 when supplying the precursor gas into the chamber 21 is used when the etching processing is performed, a silicon oxide film may be deposited on the sensor surface of the corresponding pressure gauge as the deposit. Further, the pressure within the chamber 21 set in the etching processing is lower than the pressure within the chamber 21 set in the film formation such as the PEALD. Accordingly, the accuracy of the pressure adjustment within the chamber 21 in the etching processing may be easily affected by the error of the pressure gauge. In the processing apparatus 10 according to the present exemplary embodiment, however, since the deposit that might be attached to the pressure gauge can be suppressed, it is possible to suppress the deterioration in the accuracy of the pressure adjustment within the chamber 21 in the etching processing.

Furthermore, as described in FIG. 2, for example, the substitution reaction takes place between the molecules of the precursor gas and the OH groups on the surface of the component within the chamber 21 in the adsorption process. Accordingly, a single layer of silyl groups of the molecules of the precursor gas is deposited on the sensor surface of the pressure gauge 36a used to measure the pressure within the chamber 21 in the adsorption process. On the contrary, in the reaction process, if no silyl group exists on the surface of the component within the chamber 21, the deposit is not formed on the surface of the component within the chamber 21 in principle. In the etching processing, since the pressure gauge is required to have higher accuracy than in the film formation, the pressure gauge 36b used in the reaction process, not the pressure gauge 36a used in the adsorption process, is used to measure the pressure within the chamber 21 in the etching processing. Thus, the accuracy of the pressure adjustment within the chamber 21 in the etching processing can be further improved.

<Sequence of Processing>

Figure 8:
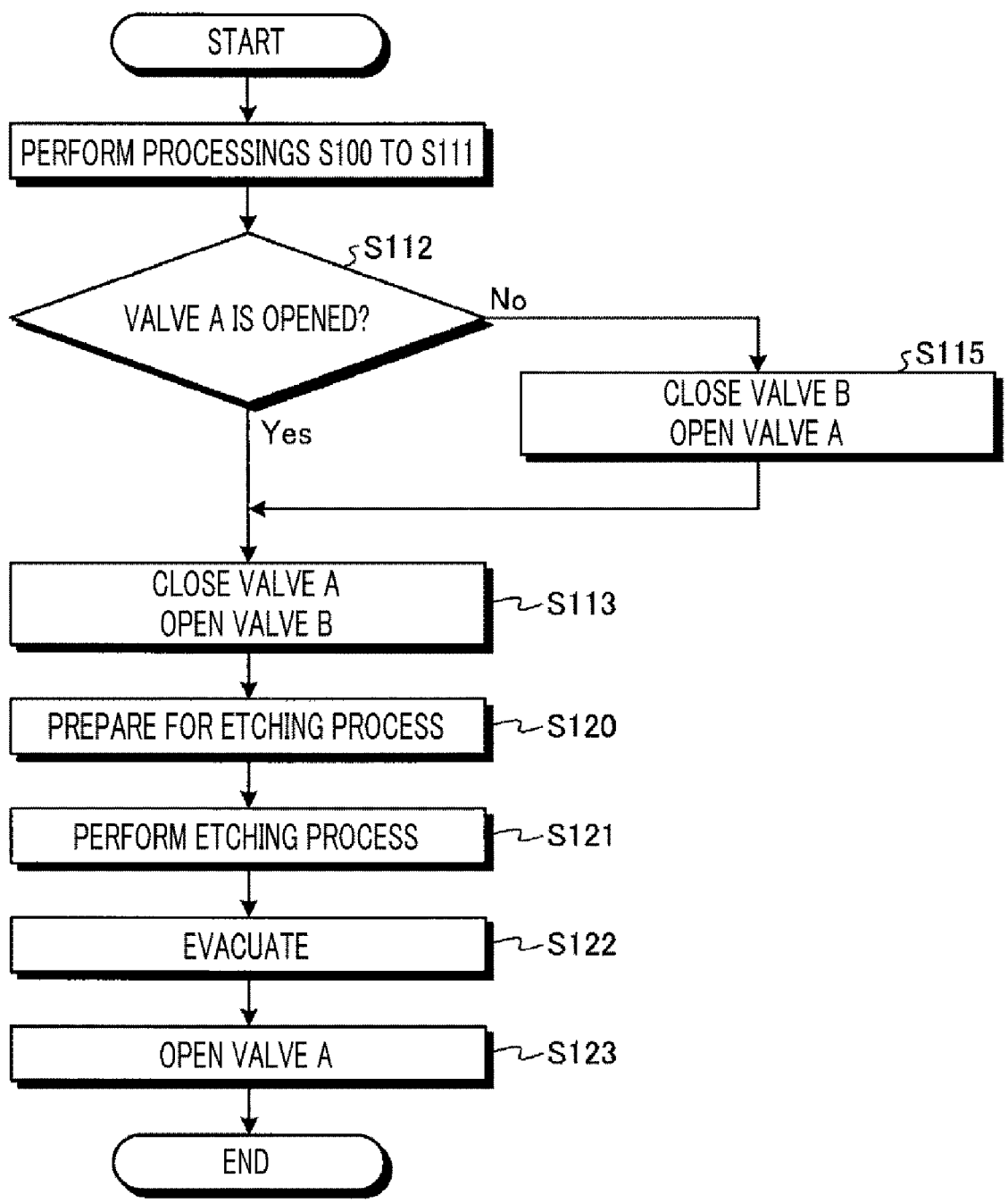
FIG. 8 is a flowchart illustrating an example of a sequence of a processing according to the second exemplary embodiment.

FIG. 8 is a flowchart for describing an example of a sequence of a processing according to the second exemplary embodiment. The processing shown in FIG. 8 is performed mainly by the control device 60. Further, since processes assigned the same reference numerals as those of FIG. 6 are the same as corresponding processes described in FIG. 6 except the following, redundant description will be omitted.

First, the control device 60 forms the film of the preset thickness on the semiconductor wafer W by performing the processings of the processes S100 to S111 shown in FIG. 6. Then, the control device 60 determines whether the valve A is in an open state (S112). If the valve A is in the open state (S112: Yes), the control device 60 controls the valve A to be closed and the valve B to be opened (S113). Accordingly, the residual gas in the valve B and the pipeline 38b is exhausted by the vacuum evacuation which is started in the process S111. Then, the control device 60 performs a processing of a process S120. Through the processing of the process S113, the pressure gauge 36a is blocked from the processing space within the chamber 21, whereas the pressure gauge 36b is exposed to the processing space within the chamber 21. The process S113 is an example of an eighth process.

Meanwhile, if the valve A is not in the open state (S112: No), that is, if the valve B is in an open state, the control device 60 controls the valve B to be closed and the valve A to be opened (S115). Accordingly, the residual gas in the valve A and the pipeline 38a is exhausted by the vacuum evacuation which is started in the process S111. Then, the control device 60 performs the processing of the process S113.

Thereafter, the control device 60 prepares for the etching process by referring to the recipe (S120). The preparation for the etching process includes, for example, a processing of adjusting the temperature of the semiconductor wafer W by performing the temperature adjustment of the coolant supplied into and circulated in the coolant path 29 of the supporting table 23, the temperature adjustment of the heater within the electrostatic chuck 25 and the pressure adjustment of the heat transfer gas supplied between the electrostatic chuck 25 and the semiconductor wafer W.

Subsequently, the control device 60 performs the etching process (S121). In the etching process, the control device 60 controls valves 50a to 50c to be closed and the valve 50d to be opened, for example, and, also, controls the flow rate of the etching gas supplied into the chamber 21 from the gas supply source 48d by controlling the MFC 49d. Accordingly, the etching gas is supplied into the chamber 21. The process of supplying the etching gas into the chamber 21 is an example of a ninth process. Further, the control device 60 adjusts the pressure within the chamber 21 by controlling the exhaust rate of the exhaust device 73 based on, for example, the pressure within the chamber 21 measured by the pressure gauge 36b. The process of adjusting the pressure of the etching gas within the chamber 21 is an example of a tenth process. Further, the control device 60 controls the high frequency power supplies 34a and 34b to apply the high frequency powers to the susceptor 24, so that the plasma of the etching gas is generated in the processing space within the chamber 21. Accordingly, the silicon oxide film on the semiconductor wafer W is etched under a preset condition. The process of generating the plasma of the etching gas in the processing space within the chamber 21 is an example of an eleventh process.

Then, the control device 60 resumes the vacuum evacuation of the chamber 21 (S122). To elaborate, the control device 60 controls the valves 50a to 50d to be closed and exhausts the gas remaining in the chamber 21 by controlling the exhaust device 73. Then, the control device 60 controls the valve A to be opened (S123) and ends the processing of FIG. 8.

In the above, the second exemplary embodiment has been described. As clearly seen from the above description, in the processing apparatus 10 according to the present exemplary embodiment, the pressure within the chamber 21 is adjusted in the etching process, which is performed in the same chamber 21 following the film forming processing, by using the pressure gauge 36b which is used in the reaction process of the PEALD. Thus, it is possible to suppress the deterioration of the accuracy of the pressure adjustment in the etching processing. Hence, the processing apparatus 10 according to the present exemplary embodiment is capable of suppressing the deterioration of the accuracy of the processing.

<Others>

In the reaction process in each cycle of the ALD in the above-described exemplary embodiments, the active species are generated by exciting the reactant gas into the plasma. However, the present disclosure is not limited thereto, and the active species may be generated by various other methods such as heat.

Further, in the above-described exemplary embodiments, the inert gas such as the nitrogen gas is supplied into the chamber 21 in the first and second purging processes in each cycle of the ALD. However, the present disclosure is not limited thereto. In the first and second purging processes in each cycle of the ALD, the purging may be performed just by stopping the supply of the gas and vacuum-evacuating the chamber 21.

Furthermore, in the above-described exemplary embodiments, the pressure gauges 36a and 36b are used as the sensors configured to measure the internal state of the chamber 21. However, the present disclosure may not be limited thereto and may also be applicable to any of various sensors such as an EPD (End Point Detector), a quadrupole mass (Q-mass) spectrometer and a sidewall potential monitor as long as at least a part of a sensor surface of the sensor is exposed to the processing space within the chamber 21 and the sensor is configured to measure the internal state of the chamber 21.

Moreover, in the above-described exemplary embodiments, the pressure gauge is implemented by the capacitance manometer. However, the present disclosure is not limited thereto. That is, another type of pressure gauge such as a pirani gauge may be used as long as at least a part of a sensor surface of the pressure gauge is exposed to the processing space within the chamber 21 and the pressure gauge is configured to measure the pressure within the chamber 21.

Further, the above exemplary embodiments have been described for the example where the film formed on the semiconductor wafer W by the ALD is the silicon oxide film. However, the present disclosure is not limited thereto, and another film such as a silicon nitride film may be formed on the semiconductor wafer W by the ALD.

In addition, in the above-described exemplary embodiments, the processing apparatus 10 uses capacitively coupled plasma (CCP) as the plasma source. However, the present disclosure is not limited thereto, and the plasma processing apparatus 10 may use any of various types of plasma sources such as inductively coupled plasma (ICP) and microwave plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A processing method, comprising:
a first process of exposing a first sensor to a processing space within a chamber in which a processing target object is accommodated and blocking a second sensor from the processing space;
a second process of supplying a first processing gas containing a precursor gas into the chamber;
a third process of controlling a state within the chamber based on a measurement value of the first sensor;
a fourth process of blocking the first sensor from the processing space and exposing the second sensor to the processing space;
a fifth process of supplying a second processing gas containing a reactant gas into the chamber; and
a sixth process of controlling the state within the chamber based on a measurement value of the second sensor,
wherein the first process to the six process are repeatedly performed multiple times, and
each of the first sensor and the second sensor is a pressure gauge.

2. The processing method of claim 1, further comprising:
a seventh process of generating plasma of the second processing gas within the chamber after the sixth process,
wherein the first process to the seventh process are repeatedly performed multiple times.

3. The processing method of claim 2, further comprising:
an eighth process of, after the first process to the seventh process are repeatedly performed a preset number of times, blocking the first sensor from the processing space and exposing the second sensor to the processing space after the seventh process;
a ninth process of supplying a third processing gas containing an etching gas into the chamber;
a tenth process of controlling the state within the chamber based on a measurement value of the second sensor; and
an eleventh process of generating plasma of the third processing gas within the chamber.

4. The processing method of claim 1,
wherein the precursor gas is a gas containing a silicon element, and
the reactant gas is a gas containing either or both of an oxygen element and a nitrogen element and not containing a silicon element.

5. The processing method of claim 1,
wherein the precursor gas is a gas containing an aminosilane-based gas, a silicon alkoxide-based gas or a halogen element as well as a silicon element.

6. The processing method of claim 1,
wherein
a pressure within the chamber is controlled based on the measurement value of the first sensor in the third process, and
the pressure within the chamber is controlled based on the measurement value of the second sensor in the sixth process.

7. The processing method of claim 6,
wherein each of the first sensor and the second sensor is a capacitance manometer.

8. A processing apparatus, comprising:
a chamber configured to accommodate a processing target object therein;
a first sensor which is a pressure gauge;
a second sensor which is a pressure gauge;
a first blocking unit configured to expose or block the first sensor to or from a processing space within the chamber;
a second blocking unit configured to expose or block the second sensor to or from the processing space;
a first supply unit configured to supply a first processing gas containing a precursor gas into the chamber;
a second supply unit configured to supply a second processing gas containing a reactant gas into the chamber; and
a control device configured to control a processing performed on the processing target object,
wherein the control device is programmed to repeatedly perform multiple times the processing comprising:
a first process of exposing the first sensor to the processing space by controlling the first blocking unit and blocking the second sensor from the processing space by controlling the second blocking unit;

a second process of supplying the first processing gas into the chamber by controlling the first supply unit;

a third process of controlling a state within the chamber based on a measurement value of the first sensor;

a fourth process of blocking the first sensor from the processing space by controlling the first blocking unit and exposing the second sensor to the processing space by controlling the second blocking unit;

a fifth process of supplying the second processing gas into the chamber by controlling the second supply unit; and a sixth process of controlling the state within the chamber based on a measurement value of the second sensor.

9. A method, comprising:
a) exposing a first pressure gauge to a processing space within a chamber and blocking a second pressure gauge from the processing space;
b) supplying a first gas containing a precursor into the processing space;
c) controlling a condition within the chamber based on a measurement value of the first pressure gauge;
d) blocking the first pressure gauge from the processing space and exposing the second pressure gauge to the processing space;
e) supplying a second gas containing a reactant gas into the processing space;
f) controlling the condition within the chamber based on a measurement value of the second pressure gauge; and
g) repeating a) to f).

10. The method of claim 9, further comprising:
h) generating plasma of the second gas within the chamber after f),
wherein g) repeats a) to h) multiple times.

11. The method of claim 10, further comprising:
i) after a) to h) are repeatedly performed a preset number of times, blocking the first pressure gauge from the processing space and exposing the second pressure gauge to the processing space;
j) supplying a third gas containing an etching gas into the chamber;
k) controlling the state within the chamber based on a measurement value of the second pressure gauge; and
l) generating plasma of the third gas within the chamber.

12. The method of claim 9,
wherein the precursor contains a silicon element, and the reactant gas is a gas containing either or both of an oxygen element and a nitrogen element and not containing a silicon element.

13. The method of claim 9,
wherein the precursor contains an aminosilane-based gas, a silicon alkoxide-based gas or a halogen element as well as a silicon element.

14. The method of claim 9,
wherein a pressure within the chamber is controlled based on the measurement value of the first pressure gauge in c), and
the pressure within the chamber is controlled based on the measurement value of the second pressure gauge in f).

15. The method of claim 14,
wherein each of the first pressure gauge and the second pressure gauge is a capacitance manometer.

16. An apparatus, comprising:
a chamber having a space for processing a target object;
a first pressure gauge;
a second pressure gauge;
a first unit configured to expose or block the first pressure gauge to or from the space;
a second unit configured to expose or block the second pressure gauge to or from the space;
a first supply configured to supply a first gas containing a precursor into the space;
a second supply configured to supply a second gas containing a reactant gas into the space; and
a controller configured to cause:
a) controlling the first unit to expose the first pressure gauge to the space and controlling the second unit to block the second pressure gauge from the space;
b) controlling the first supply to supply the first gas into the space;
c) controlling a condition within the chamber based on a measurement value of the first pressure gauge;
d) controlling the first unit to block the first pressure gauge from the space and controlling the second unit to expose the second pressure gauge to the space;
e) controlling the second supply to supply the second gas into the space;
f) controlling the condition within the chamber based on a measurement value of the second pressure gauge; and
g) repeating a) to f).

* * * * *